United States Patent [19]

Visser

[11] Patent Number: 4,647,338
[45] Date of Patent: Mar. 3, 1987

[54] METHOD OF MANUFACTURING A SEMICONDUCTOR DEVICE, IN WHICH A SEMICONDUCTOR SUBSTRATE IS SUBJECTED TO A TREATMENT IN A REACTION GAS

[75] Inventor: Jan Visser, Eindhoven, Netherlands

[73] Assignee: U.S. Philips Corporation, New York, N.Y.

[21] Appl. No.: 759,996

[22] Filed: Jul. 29, 1985

[30] Foreign Application Priority Data

Aug. 30, 1984 [NL] Netherlands ............... 8402636

[51] Int. Cl.$^4$ .............. H01L 21/306; B44C 1/22; C03C 15/00; B05D 3/06
[52] U.S. Cl. .................. 156/643; 118/50.1; 118/620; 118/728; 156/345; 156/646; 156/656; 156/665; 204/192.32; 204/192.12; 204/298; 427/38
[58] Field of Search ............ 156/643, 646, 656, 659.1, 156/665, 345; 204/164, 192 E, 192 EC, 192 C, 298; 427/38, 39; 118/728, 50.1, 620

[56] References Cited

U.S. PATENT DOCUMENTS 4,371,412  2/1983  Nishizawa ............... 156/345

4,401,507  8/1983  Engle ............... 156/345 X
4,551,197  11/1985  Guilmette et al. ............... 156/345 X

FOREIGN PATENT DOCUMENTS 59-55022  3/1984  Japan ............... 156/345

Primary Examiner—William A. Powell
Attorney, Agent, or Firm—Paul R. Miller

[57] ABSTRACT

A method of manufacturing a semiconductor device, in which a semiconductor substrate (1) is subjected to a surface treatment in a reactor vessel (2), through which a current (3) of a reaction gas is passed and is then pumped away by means of a mechanical pump (14) and a cooling trap (15) arranged between this pump (14) and the reactor vessel (2). The current of reaction gas (3) consists of a current ($Q_c$) of gas condensable in the cooling trap (15) and a current ($Q_i$) of an inert gas. According to the invention, a separate current ($Q_x$) of an inert gas is conducted to the mechanical pump (14). This current ($Q_x$) is practically equally as large as the current of condensable gas ($Q_c$). Thus, a method is obtained, in which the partial pressure of the inert gas ($P_i$) and that of the condensable gas ($P_c$) in the reactor gas can be controlled to the optimum and separately.

7 Claims, 1 Drawing Figure

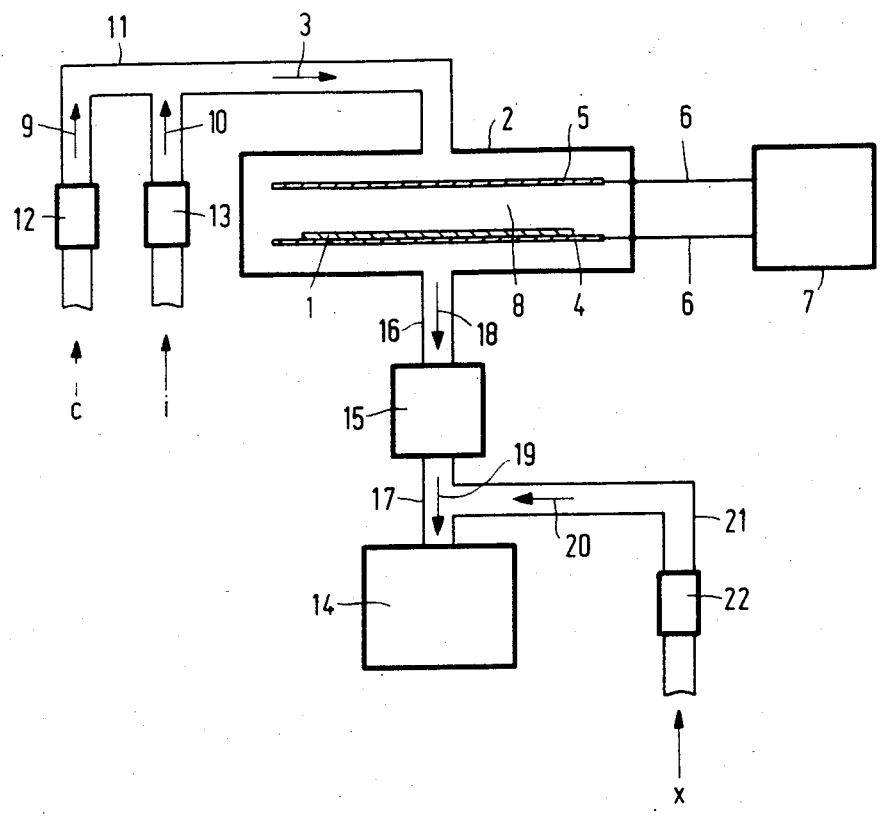

METHOD OF MANUFACTURING A SEMICONDUCTOR DEVICE, IN WHICH A SEMICONDUCTOR SUBSTRATE IS SUBJECTED TO A TREATMENT IN A REACTION GAS

The invention relates to a method of manufacturing a semiconductor device, in which a semiconductor substrate is subjected to a surface treatment in a reactor vessel through which a current of a reaction gas is passed and is then pumped away by means of a mechanical pump and a cooling trap arranged between this pump and the reactor vessel, the current of reaction gas consisting of a current of gas condensable in the cooling trap and a current of inert gas not condensable in the cooling trap.

Such a method is more particularly suitable for manufacturing semiconductor devices, in which during the manufacture a layer of material has to be deposited on a semiconductor substrate from a reaction gas (Chemical Vapour Deposition) or a layer has to be locally etched away from a semiconductor substrate by means of a plasma produced in a reaction gas (Plasma Etching or Reactive Ion Etching). The current of gas condensable in the cooling trap nearly always contains a corrosive constituent, such as chlorine or a chlorine compound. Since the condensable gas is collected in a cooling trap, it is achieved that the pump arranged behind the cooling trap cannot be attacked by the corrosive gas and that oil present in the pump cannot be contaminated by the corrosive gas. Gas contained in this oil can be released again at undesired instants and can then disturb the procedure.

In a known method of the kind mentioned in the opening paragraph, the current of inert gas in the current of the reaction gas is many times larger than the current of gas condensable in the cooling trap. Thus, it is ensured that a variation of the current of the condensable gas supplied to the reactor vessel practically means a proportional variation of the partial pressure of the condensable gas in the reactor vessel.

A disadvantage of this known method is the use of a comparatively large current of inert gas. Thus, it is necessary to use a pump of comparatively high pumping capacity.

The invention has inter alia for its object to provide a method, in which the partial pressure of the condensable gas in the reactor vessel is practically proportional to the extent of the current of the condensable gas without the current of the inert gas being many times larger than the condensable gas. The current of the inert gas —and hence the pumping capacity—can then be comparatively small.

According to the invention, for this purpose the method of the kind mentioned in the opening paragraph is characterized in that there is conducted to the mechanical pump a separate current of an inert gas which is practically equally as large as the current of gas condensable in the cooling trap.

Measurements have shown that in practice during operation a cooling trap practically does not exhibit any flow resistance and that all condensable gases in the current of gas are collected in the cooling trap. Moreover, the quantity of material (measured in torr.l.) in the gas current flowing towards the reactor vessel will be practically equal to that in the gas current flowing away from the reactor vessel.

Although in the reactor vessel part of the reaction gas is used for depositing a layer of material or for etching away a layer of material, this part is very small.

Due to the measure according to the invention, it has been found that the partial pressure $P_c$ of the condensable gas and the partial pressure $P_i$ of the inert gas in the reactor vessel are equal to $Q_c/S_p$ and $Q_i/S_p$, respectively, wherein $Q_c$ represents the volume of the current of gas condensable in the cooling trap conducted to the reactor vessel (measured in Torr l/s), $Q_i$ represents the volume of the current of inert gas conducted to the reactor vessel (measured in Torr l/s) and $S_p$ represents the flow rate of the mechanical pump (measured in l/s). Both the partial pressure $P_c$ and the partial pressure $P_i$ depend at a constant flow rate $S_p$ of the pump only upon the volume of the current of the relevant gas conducted to the reactor vessel. Due to this measure according to the invention, the partial pressure $P_c$ is not influenced by the volume of the current of inert gas and the partial pressure $P_i$ is not influenced by the volume of the current of condensable gas. Thus, an optimum process control is obtained.

The measure according to the invention is particularly effective if the surface treatment is an etching treatment and if as condensable gas a mixture of $CCl_4$ or $BCl_3$ and $Cl_2$ and as inert gas He or Ar is conducted into the reactor vessel. Preferably, the overall pressure in the reactor vessel then is 0.1 to 10 Torr.

The invention will now be described more fully with reference to a drawing, the sole FIGURE of which shows diagrammatically an arrangement for carrying out the method according to the invention.

The FIGURE shows diagrammatically an arrangement for carrying out the method of manufacturing a semiconductor device, in which a semiconductor substrate 1 is subjected to a surface treatment in a reactor vessel 2, through which a current of reaction gas indicated diagrammatically by the arrow 3 is passed. In the reactor shown, the semiconductor substrate 1 is provided on a first electrode 4 of a system of electrodes 4, 5. By means of leads 6, the electrodes 4, 5 are connected to a generator 7, by which such a high-frequency signal can be applied to the electrodes 4, 5 that a plasma is produced in the reaction gas in the space 8 between the electrodes 4, 5. Constitutes of this plasma can then locally etch away a layer from the semiconductor substrate 1. In such a reactor vessel, instead of etching away, as stated, a layer of material, alternatively a layer of material may be deposited on the semiconductor substrate 1. The semiconductor substrate 1 is then heated to a temperature of, for example, 400° to 1000° C.

The current of reaction gas 3 consists of a current indicated by an arrow 9 of a gas condensable in a cooling trap and a current indicated by an arrow 10 of an inert gas. The reactor vessel 2 is connected for this purpose by means of a system of tubes 11 and current regulators 12, 13 (mass flow meters) to sources (not shown further) for this condensable gas c and inert gas i. The reaction gas is then pumped away by means of a mechanical pump 14 and a cooling trap 15 which is arranged between this pump 14 and the reactor vessel 2 and in which the condensable gas is collected. The cooling trap 15 is connected for this purpose through a lead 16 to the reactor vessel 2, while the pump 14 is connected through a lead 17 to the cooling trap 15.

The current of condensable gas 9 nearly always contains a corrosive constituent—that may be activated in the plasma-, such as chlorine or a chlorine compound. For etching a layer of aluminium present on the semiconductor substrate 1, the reaction gas 3 consists, for example, of a current of condensable gas of a mixture of CCl$_4$ or BCl$_3$ and Cl$_2$ and a current of inert gas of He or Ar. The overall pressure in the reactor vessel 2 is then 0.1 to 10 Torr.

The condensable gas in the gas current indicated by the arrow 18, which leaves the reactor vessel 2, is collected in the cooling trap 15. It has been found that practically no condensable gas can be detected in the gas current (indicated by the arrow 19) leaving the cooling trap 15. By means of a mass spectrometer, when the gas current 9 contained Cl$_2$ and CCl$_4$, no Cl-containing constituent could any longer be detected in the gas current 19. By the use of the cooling trap 15, it is thus avoided that corrosive gases reach the mechanical pump 14.

According to the invention, a separate current of an inert gas indicated by an arrow 20 is conducted to the mechanical pump 14. The pump 14 is connected for this purpose through a lead 21 in a current regulator 22 (mass flow meter) to a source (not shown further) for inert gas X. According to the invention, the current regulator 22 is adjusted so that the current of additional inert gas 20 is practically equal to the current 9 of gas condensable in the cooling trap which is conducted to the reactor vessel 2.

It has further been found that during operation the cooling trap 15 substantially does not exhibit any flow resistance; in fact no pressure gradient occurs across the cooling trap. Moreover, the quantity of material (measured in Torr.1) in the gas current 3 towards the reactor vessel 2 will be substantially equal to that in the gas current 18 away from the reactor vessel 2. On the basis of the aforementioned data, the partial pressure P$_c$ of the condensable gas and the partial pressure P$_i$ of the inert gas in the reactor vessel can now be calculated in a simple manner.

It holds for the overall pressure P$_1$ behind the reactor vessel 2, but before the cooling trap 15, that:

$$P_1 = \frac{Q_c + Q_i}{s_1}$$

wherein Q$_c$ represents the volume of the current of condensable gas 9 (measured in Torr 1/s), Q$_i$ represents the volume of the current of inert gas 10 (measured in Torr 1/s) and S$_1$ is the flow rate of the gas for the cooling trap 15 (measured in 1/s). It holds for the overall pressure P$_2$ behind the cooling trap 15 that:

$$P_2 = \frac{Q_i + Q_x}{S_p}$$

wherein Q$_x$ represents the volume of the current of additional inert gas 20 (measured in Torr 1/s) and S$_p$ represents the flow rate of the pump 14. Because P$_1$=P$_2$, it consequently also holds that:

$$S_1 = \frac{Q_i + Q_c}{Q_i + Q_x}$$

The partial pressure P$_c$ is now:

$$P_c = \frac{Q_c}{S_1} = \frac{Q_c}{S_p} \cdot \frac{Q_i + Q_x}{Q_i + Q_c}$$

and the partial pressure P$_i$ is:

$$P_i = \frac{Q_i}{S_1} = \frac{Q_i}{S_p} \cdot \frac{Q_i + Q_x}{Q_i + Q_c}$$

According to the measure in accordance with the invention, also Q$_x$=Q$_c$ so that then $$P_c = \frac{Q_c}{S_p} \text{ and } P_i = \frac{Q_i}{S_p}.$$

Therefore, it has been found that in the method according to the invention both the partial pressure P$_c$ and the partial pressure P$_i$ depend at a constant flow rate S$_p$ of the pump only upon the volume of the current of the relevant gas conducted to the reactor vessel. Thus, an optimum process control is obtained.

The effect of the measure according to the invention can be illustrated most clearly by calculating the partial pressures P$_c$ and P$_i$ for the case in which no additional current is thus conducted to the pump 14; so if Q$_x$=0, it holds that:

$$P_c = \frac{Q_c}{S_p} \cdot \frac{Q_i}{Q_i + Q_c} = \frac{Q_c}{S_p} \cdot \frac{1}{1 + Q_c/Q_i}$$

and $$P_i = \frac{Q_i}{S_p} \cdot \frac{Q_i}{Q_i + Q_c} = \frac{Q_i}{S_p} \cdot \frac{1}{1 + Q_c/Q_i}.$$

It clearly appears therefrom that without the measure according to the invention the pressure P$_c$ is influenced not only by Q$_c$, but also by Q$_i$ and that the pressure P$_i$ is influenced no only by Q$_i$, but also by Q$_c$. Thus, the process can be controlled only with difficulty. In a known method, Q$_i$ is chosen much larger than Q$_c$ so that then at any rate it again holds on approximation that:

$$P_c = \frac{Q_c}{S_p} \text{ and } P_i = \frac{Q_i}{S_p}.$$

However, the pump 14 must now have an additionally high capacity. The pressure P$_c$ then cannot be so high as in the method according to the invention, however.

Although, as stated, the method according to the invention may be used for many processes, the surface treatment is preferably an etching treatment, in which as condensable gas a mixture of CCl$_4$ or BCl$_3$ and Cl$_2$ and as inert gas He or Ar is introduced into the reactor vessel. The overall pressure is then preferably 0.1 to 10 Torr. In these cases, a very good process control is obtained by the measure according to the invention, especially if the cooling trap is cooled with liquid nitrogen and if as inert gas conducted to the pump use is made of He, Ar or N$_2$ or a mixture thereof.

Finally, it should be noted that by means of the quantity of inert gas Q$_x$ conducted to the mechanical pump 14, the partial pressures P$_c$ and P$_i$ in the reactor vessel 2 can be varied with fixed gas currents Q$_i$ and Q$_c$. These variations are then equally large.

What is claimed is:

1. A method of manufacturing a semiconductor device, in which a semiconductor substrate is subjected to a surface treatment in a reactor vessel, through which a current of a reaction gas is passed and is then pumped away by means of a mechanical pump and a cooling trap arranged between this pump and the reactor vessel, the current of reaction gas consisting of a current of gas condensable in the cooling trap and a current of inert gas not condensable in the cooling trap, characterized in that there is conducted to the mechanical pump a separate current of an inert gas which is substantially equally as large as the current of gas condensable in the cooling trap.

2. A method as claimed in claim 1, characterized in that the cooling trap is cooled by means of liquid nitrogen.

3. A method as claimed in claim 1 or 2, characterized in that the inert gas conducted to the mechanical pump consists of helium, argon or nitrogen or a mixture thereof.

4. A method as claimed in claims 1 or 2, characterized in that the surface treatment is an etching treatment and in that as condensable gas a mixture of $CCl_4$ or $BCl_3$ and $Cl_2$ and as inert gas helium or argon is introduced into the reactor vessel.

5. A method as claimed in claim 4, characterized in that the overall pressure in the reactor vessel is 0.1 to 10 Torr.

6. A method as claimed in claim 3, characterized in that the surface treatment is an etching treatment and in that as condensable gas a mixture of $CCl_4$ or $BCl_3$ and $Cl_2$ and as inert gas helium or argon is introduced into the reactor vessel.

7. A method as claimed in claim 6, characterized in that the overall pressure in the reactor vessel is 0.1 to 10 Torr.

* * * * *